(12) United States Patent (10) Patent No.: US 7,451,419 B2
Osanai (45) Date of Patent: Nov. 11, 2008

(54) CIRCUIT LAYOUT DEVICE, CIRCUIT LAYOUT METHOD, AND PROGRAM FOR EXECUTION THEREOF

(75) Inventor: Ayumu Osanai, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 264 days.

(21) Appl. No.: 11/411,947

(22) Filed: Apr. 27, 2006

(65) Prior Publication Data

US 2006/0265683 A1 Nov. 23, 2006

(30) Foreign Application Priority Data

May 19, 2005 (JP) ............................. 2005-146434

(51) Int. Cl.
*G06F 17/50* (2006.01)
(52) U.S. Cl. ................................. 716/10; 716/8; 716/13
(58) Field of Classification Search .................... 716/10, 716/8, 13
See application file for complete search history.

(56) References Cited

U.S. PATENT DOCUMENTS 7,127,695 B2 * 10/2006 Huang et al. ................... 716/10

FOREIGN PATENT DOCUMENTS

JP 3-135067 A1 6/1991

\* cited by examiner

*Primary Examiner*—Brandon W Bowers
(74) *Attorney, Agent, or Firm*—Foley & Lardner LLP

(57) ABSTRACT

A circuit layout device of a semiconductor integrated circuit having scan chains comprises a circuit layout section for performing the circuit layout of a semiconductor integrated circuit considering a weighting factor being set for a wire of the semiconductor integrated circuit and outputting the layout data, a wire length calculation section for calculating a wire length of a scan chain from the layout data output by the circuit layout section and a wire weighting section for increasing the weighting factor of the scan chain wire based on the scan chain wire length calculated by the wire length calculation section.

8 Claims, 3 Drawing Sheets

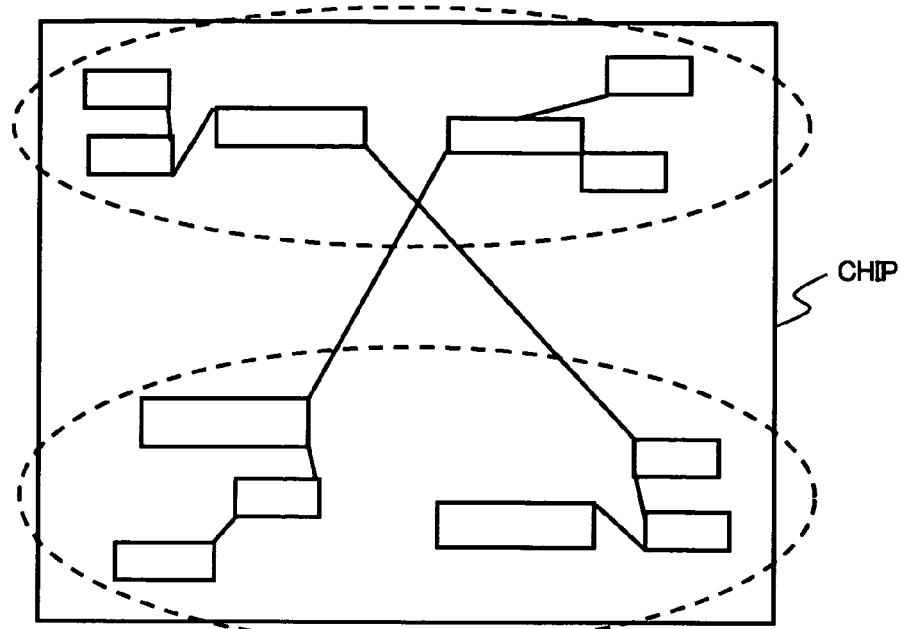
*FIG. 3A*
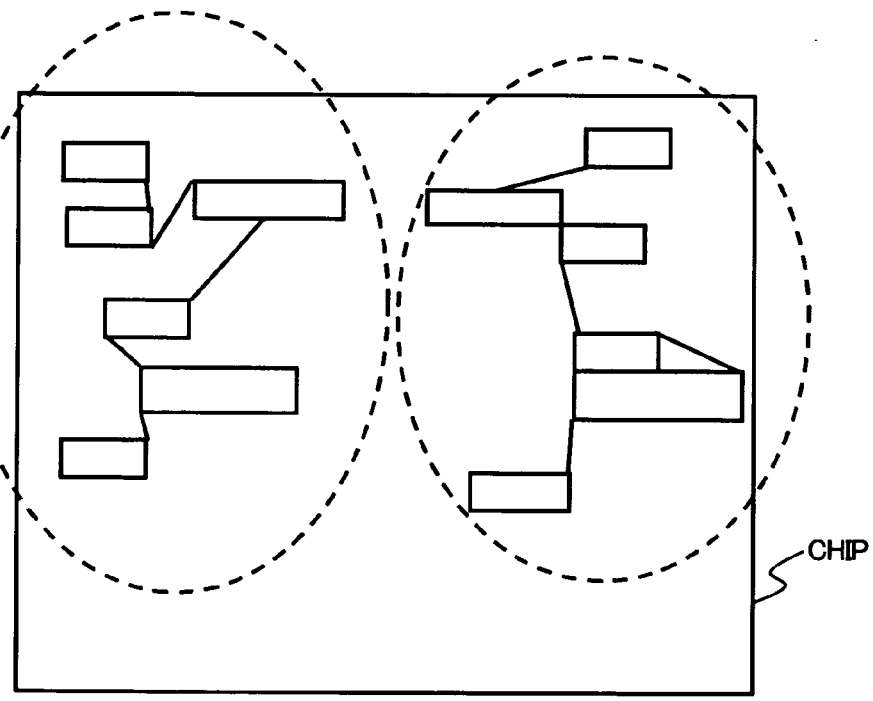
*FIG. 3B*
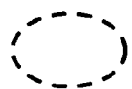 GROUPS WHICH SIGNALS ARE CONNECTED LOGICALLY
 WIRES OF SCAN CHAINS

CIRCUIT LAYOUT DEVICE, CIRCUIT LAYOUT METHOD, AND PROGRAM FOR EXECUTION THEREOF

BACKGROUND OF THE INVENTION

1. Field of the Invention

The present invention relates to a circuit layout device, circuit layout method and a program for executing this circuit layout method, and more particularly to a circuit layout device, circuit layout method and a program for executing this circuit layout method of an integrated circuit having scan chains.

2. Description of the Related Art

Recently a scan type test circuit is often mounted to simplify testing of a semiconductor device as semiconductor devices become faster and a density of semiconductor circuit is enlarged. In the case of a conventional circuit, when circuit layout is decided, layout is considered so that wiring in the user circuit block becomes short, without considering wiring of the scan chain. The wiring of the scan chains is generally decreased in rechaining, which is for reconnecting the scan chains after circuit layout is decided.

An example of considering the scan chains in a circuit layout is disclosed in Japanese Unexamined Patent Application Publication No. 3-135067. The technology disclosed in Japanese Unexamined Patent Application Publication No. 3-135067 distributes scan gates considering the routability of the user circuits, and no consideration is made here to minimize the wires of the scan chains.

Recently, however, to decrease the test time, the number of scan chains to be set for one semiconductor device is increasing. In some cases several hundred or even several thousand of scan chains may be prepared for one semiconductor device. In such a semiconductor device, the man power to rechain the scan chains after circuit layout is decided would be enormous.

Therefore a circuit layout method that can decrease the wires of the scan chains has been desired. Minimizing the wire length of the scan chains is preferable as the number of scan chains increases.

SUMMARY OF THE INVENTION

According to one aspect of the present invention, a circuit layout device of a semiconductor integrated circuit having scan chains comprises a circuit layout section for performing the circuit layout of a semiconductor integrated circuit considering a weighting factor being set for a wire of the semiconductor integrated circuit and outputting the layout data, a wire length calculation section for calculating a wire length of a scan chain from the layout data output by the circuit layout section and a wire weighting section for increasing the weighting factor of the scan chain wire based on the scan chain wire length calculated by the wire length calculation section.

According to another aspect of the present invention, a circuit layout method for a semiconductor integrated circuit having scan chains comprises performing circuit layout of the semiconductor integrated circuit based on connection information of a user circuit, calculating a wire length of a scan chain wire from layout data based on the circuit layout and increasing a weighting factor of a scan chain wire during layout based on the calculated scan chain wire length.

According to another aspect of the present invention, a circuit layout program for having a computer execute circuit layout of a semiconductor integrated circuit having scan chains. The program having the computer execute a first step of reading circuit connection information, performing circuit layout considering a weighting factor being set for a wire of this circuit connection information, and creating layout data, a second step of calculating a wire length of a scan chain from the layout data and a third step of increasing a weighting factor of a scan chain wire during circuit layout based on the calculated scan chain wire length.

BRIEF DESCRIPTION OF THE DRAWINGS

The above and other objects, advantages and features of the present invention will be more apparent from the following description taken in conjunction with the accompanying drawings, in which:

FIGS. 3A and 3B show images when circuit layout of the present invention is performed.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1:
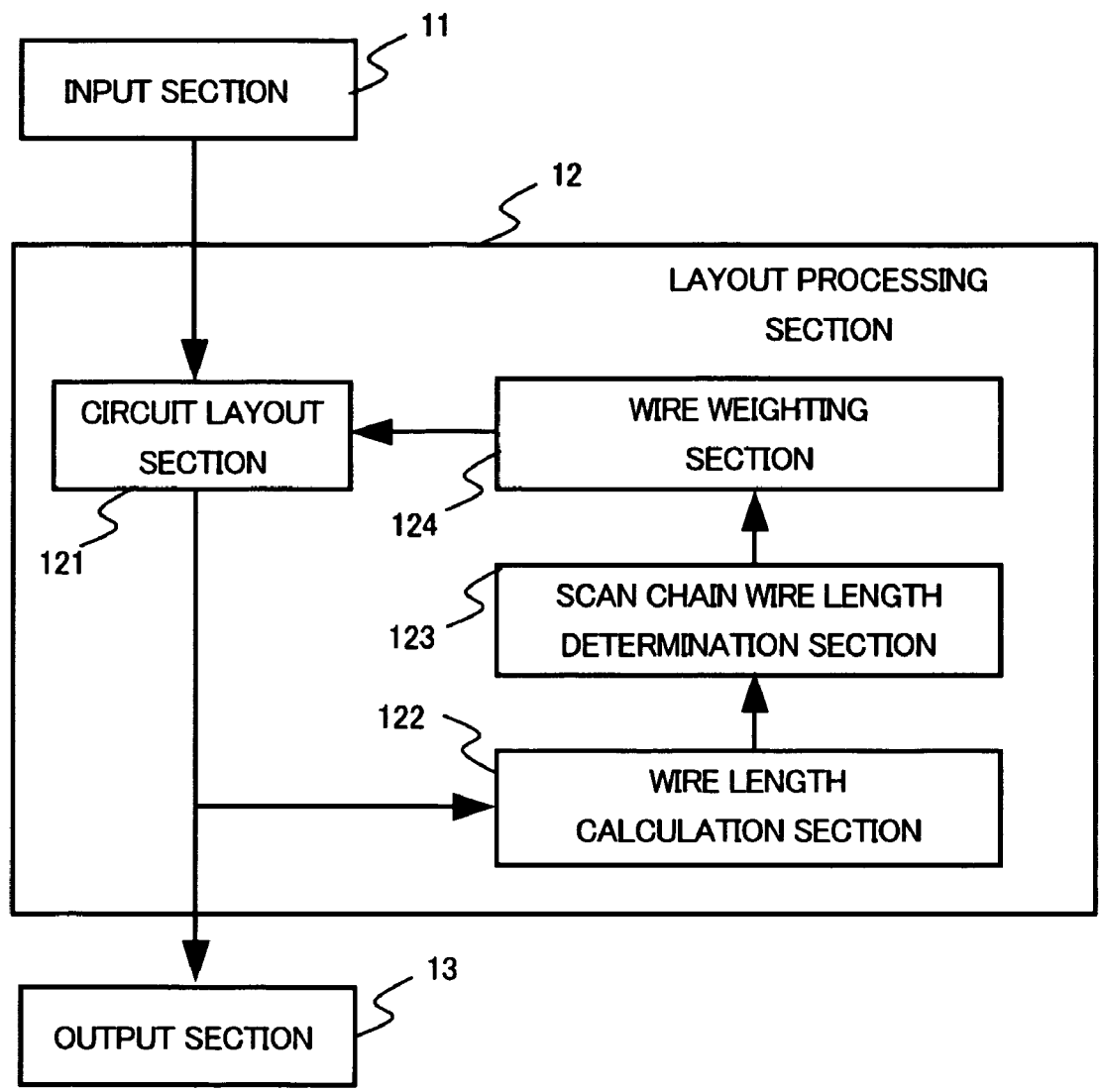
FIG. 1 is a block diagram depicting the circuit layout device according to Embodiment 1 of the present invention.

Embodiments of the present invention will now be described with reference to the drawings. FIG. 1 is a block diagram depicting the circuit layout device according to Embodiment 1 of the present invention. The circuit layout device of the present embodiment is a computer, for example, comprising an input section 11, a layout processing section 12 and an output section 13. The input section 11 shown in FIG. 1 is a section to which data is input from a keyboard, recording medium or another processing device, for example, and the output section 13 is a section to output data to a display, recording medium or another processing device, for example. The layout processing section 12 comprises a circuit layout section 121, wire length calculation section 122, scan chain wire length determination section 123 and wire weighting section 124.

The input section 11 is a section to which information, such as user circuit connection information and circuit group (scan group) connected by one scan chain, is input. This information is input by the format of the net list of the user circuit to be designed and the net list of the scan group of the scan chains, for example.

The layout processing section 12 is section to determine the circuit layout and the wiring including scan chains, and determine the layout data. In the layout processing section 12, the above mentioned circuit layout section 121, wire length calculation section 122, scan chain wire length judgment section 123 and wire weighting section 124 are implemented by computer software, for example.

The circuit layout section 121 performs circuit layout based on the circuit layout including scan chains, and the connection information of the user circuit and the scan groups that are input, and generates and outputs the layout data. When the circuit layout is performed, the weighting factor to be set for the wires of the scan chains and the user circuit are considered.

The wire length calculation section 122 extracts the layout data on scan chains from the layout data generated by the circuit layout section 121, and calculates the wire length of the scan chains.

The scan chain wire length determination section 123 compares the scan chain wire length of the layout data and the upper limit value SCL of the wire length, and outputs the comparison result.

The wire weighting section 124 increases the weights of the scan chain wires based on the result of the scan chain wire length judgment section 123. It is assumed that this wire weighting section 124 can increase the weights of the scan chain wires of an arbitrary scan group based on the result of the scan chain wire length determination section 123.

The output section 13 outputs the final circuit layout determined by the layout processing section 12 as the layout data.

Figure 2:
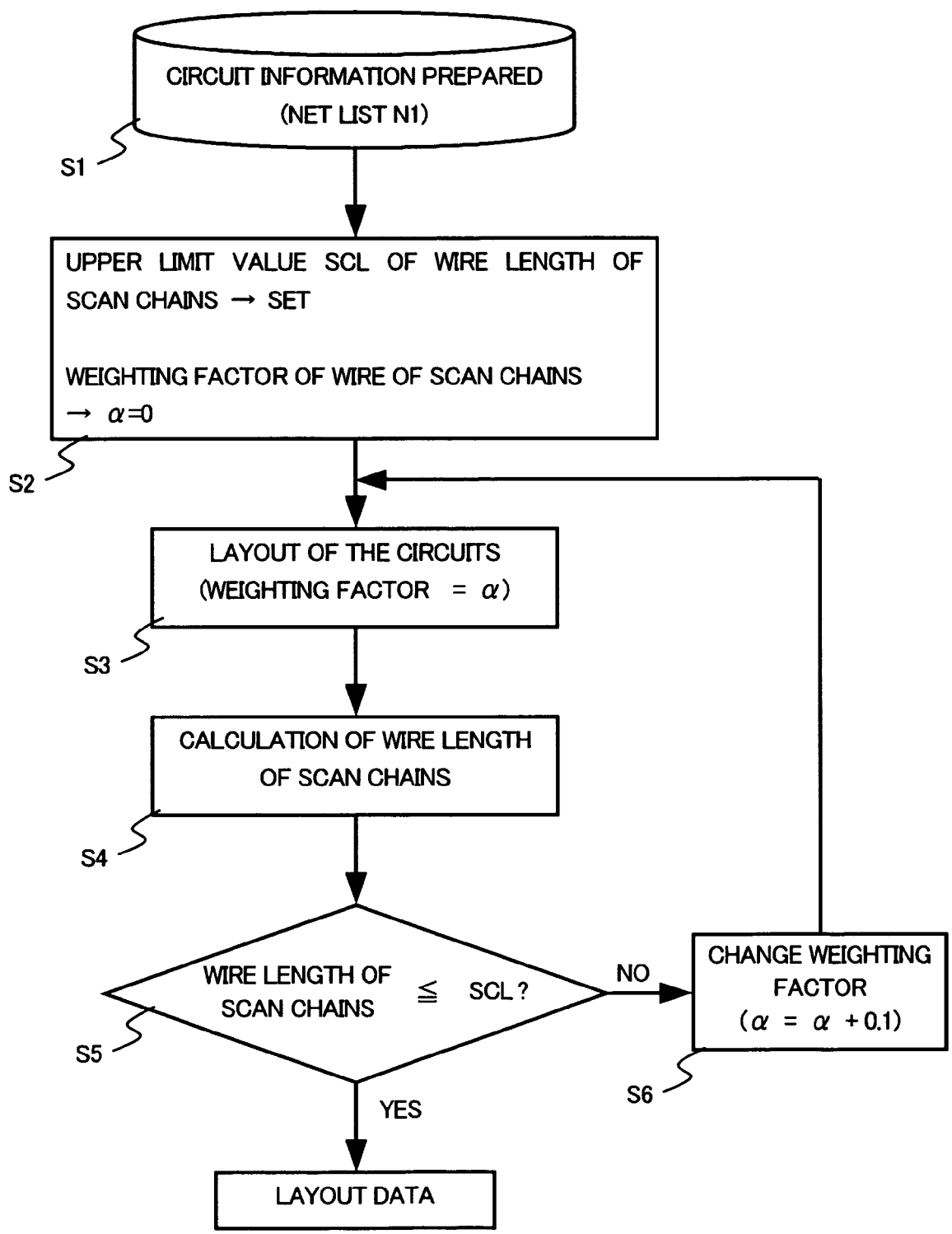
FIG. 2 shows a flow chart of a method of arranging layout of the embodiment.

Now the circuit layout method using the circuit layout device in FIG. 1 will be described in detail. In the present embodiment it is assumed that the circuit blocks where one scan chain passes through has been set in advance in the semiconductor device. In the circuit layout method of the present embodiment, a method of arranging layout of the circuits of the semiconductor device will be described. The semiconductor device has a plurality (e.g. several hundred—several thousand) of scan chains for which circuit blocks to pass through have been set in advance. FIG. 2 shows a flow chart of a method of arranging layout of the embodiment.

In step S1, a net list having information on the circuit to be designed (hereafter called "user circuit") and information on scan chains is prepared. This net list N1 includes the connection information of the user circuits and connection information of the scan groups. This net list N1 is input to the circuit layout device via the above mentioned input section 11.

Then in step S2, the upper limit value SCL of the wire length of the scan chains is set. Also in this stage, $\alpha=0$ is set as the weighting factor to indicate weight for automatic wire placement of the scan chain. This weighting factor $\alpha$ is set for scan wires corresponding to one scan chain. The upper limit value SCL of these wires may be input via the input section, together with the net list, or may be set according to the size and type of chip, and stored in the circuit layout device.

Now the weighting factor $\alpha$ will be described. Circuit layout is performed considering the wire length, and the wire length considered in this case is the actual wire length of an individual wire multiplied by the factor. This factor is the weighting factor $\alpha$ of the wire. The weighting factor $\alpha$ is set, for example, by a numeric in $0 \leq \alpha \leq 1$, such as the initial value of the general signal wire is $\alpha=1$ and the initial value of the scan chain wire is $\alpha=0$.

The circuit layout section 121 performs circuit layout considering the weighting of the signal wire of the user circuit and the weighting of the scan chain wire. If the weighting factor of the scan chain is $\alpha=0$ (initial value) when the weighting factor of the signal wire of the user circuit is $\alpha=1$ (initial value), then the circuit block to which the signals are logically connected to the user circuit is placed so that the wire length of this signal wire becomes short. At this time of layout the wire length of the scan chain wires is not considered. In this way according to the present embodiment, layout is performed considering the wire length of the user circuit at initial layout.

In step S4, the wire length of each scan chain is calculated by the wire length calculation section 122 from the layout data of the circuits automatically placed. The calculated wire length of the scan chain is output to the scan chain wire length judgment section 123.

In step S5, the scan wire length judgment section 123 compares the upper limit value SCL of the scan chain wires, which is set in advance, and the wire length of the scan chain calculated by the wire length calculation section 122. If the wire length of each scan chain is less than the SCL which was set in step S2, the circuit layout including the scan chains ends. If a wire of the scan chain which exceeds the upper limit value SCL exists, processing advances to step S6.

In step S6, the weighting factors for wires of the scan chains are changed. In other words, in the net list weight is increased for the wires of the scan chains as wires to be considered during circuit layout. In this embodiment, the weight is increased 0.1, that is the weighting factor of the scan chain wires is $\alpha=\alpha+0.1$. After executing this processing, processing returns to step S3, where circuit layout is performed again.

When processing returns to step S3, the weight of the wires of the scan chains has been increased, such as $\alpha=0.1$, compared with the initial circuit layout. Based on the net list where the weight of the wires of the scan chains have been increased, the circuit layout section 121 performs circuit layout.

In the circuit layout method of the present embodiment, steps S3 to S6 are repeated, and circuit layout ends when all the scan chain wires do not exceed the upper limit value SCL. Circuit layout decided like this is output from the output section 13 as the layout data.

In this way, information on the scan chains is added to the net list of the circuit layout, and if a scan chain wire exceeds the upper limit value during circuit layout, circuit layout is executed while increasing the weight of the scan chain wire so that the wires of scan chains can be routed to be a predetermined length or less, while assigning priority to the wire length and the connection of the user circuits. FIGS. 3A and 3B show images when circuit layout is performed like this. FIG. 3A shows circuit blocks logically connected with scan chains when weighting is not performed for the scan chain wires. If circuit layout is performed considering only logical connection, as shown in FIG. 3A, circuit blocks related to each other in a scan chain may be placed distant from each other, and the scan chain becomes unnecessarily long. Whereas according to the present embodiment, circuit layout is performed while sequentially increasing the wire weight for scan chains exceeding the upper limit value SCL, so as FIG. 3B shows, the scan chain wires can be placed short while considering the signal connection. Also the wire length of scan chains is considered during circuit layout, and the man power required for the rechaining of the scan chains can be dramatically decreased. Also by making the scan chain wires short, the circuit area required for scan chain wiring can be decreased, which makes it possible to decrease the area of the semiconductor device.

In the above described embodiment, the information to be input to the input section 11 is a net list having the connection information of the user circuits and the connection information on the scan chains, but information on the scan chains (e.g. number of chains, circuit blocks where each scan chain passes through) may be input after circuit layout is performed from the net list for the user circuits, then the scan chain wire lengths may be determined based on the scan chain information which was input. According to the present invention, layout is performed while increasing the weighting factor in circuit layout for a scan chain of which the scan chain wire becomes long, therefore no scan chain having a wire length exceeding the upper limit value SCL exists in the layout data to be output by the output section 13 even if the number of scan chains increase. As a result, the number of scan chains can be effectively increased to decrease the scan test time when a scan test is performed.

It is apparent that the present invention is not limited to the above embodiment and it may be modified and changed without departing from the scope and spirit of the invention.

What is claimed is:

1. A circuit layout device of a semiconductor integrated circuit having scan chains, comprising:
    a circuit layout section for performing the circuit layout of a semiconductor integrated circuit considering a weighting factor being set for a wire of the semiconductor integrated circuit, and outputting the layout data;
    a wire length calculation section for calculating a wire length of a scan chain from the layout data output by the circuit layout section;
    a wire weighting section for increasing the weighting factor of the scan chain wire based on the scan chain wire length calculated by the wire length calculation section; and
    a scan chain wire determination section for comparing the scan chain wire length calculated by the wire length calculation section and a predefined upper limit value of scan chain wire length, wherein the wire weighting section increases the weighting factor of the scan chain wire based on the comparison result of the scan chain wire determination section.

2. The circuit layout device according to claim 1, wherein the weighting factor of the scan chain wire is set to be lower than the weighting factor of a signal wire of the semiconductor integrated circuit.

3. A circuit layout method for a semiconductor integrated circuit having scan chains, comprising:
    providing a predefined upper limit value of scan chain wire length;
    performing a first circuit layout of the semiconductor integrated circuit based on connection information of a user circuit;
    calculating a wire length of a scan chain wire from layout data based on the first circuit layout;
    comparing the calculated scan chain wire length with the predefined upper limit;
    increasing a weighting factor of a scan chain wire if the calculated scan chain wire length is determined greater than the predefined upper limit during the step of comparing; and
    performing another circuit layout using the increased weighting factor of the scan chain wire.

4. One or more computer readable media storing computer readable instructions that, when executed, perform a circuit layout method of claim 3 for a semiconductor integrated circuit having scan chains.

5. The circuit layout method according to claim 3, further comprising at least one cycle of following steps:
    comparing the previous calculated scan chain wire length with the predefined upper limit value of the scan chain wire length;
    performing another circuit layout using a further increased weighting factor of the scan chain wire if the previous calculated scan chain wire length is determined greater than the predefined upper limit during the step of comparing;
    calculating a wire length of a scan chain wire from layout data based on the another circuit layout; and
    ending the cycle if the latest calculated scan chain wire length is determined smaller than or equal to the upper limit during the step of comparing.

6. One or more computer readable media storing computer readable instructions that, when executed, perform a circuit layout method of claim 5 for a semiconductor integrated circuit having scan chains.

7. The circuit layout method according to claim 3, wherein the weighting factor of the scan chain wire is set to be lower than the weighting factor of a signal wire of the semiconductor integrated circuit.

8. One or more computer readable media storing computer readable instructions that, when executed, perform a circuit layout method of claim 7 for a semiconductor integrated circuit having scan chains.

* * * * *